(12) United States Patent
Barbato

(10) Patent No.: US 10,168,061 B2
(45) Date of Patent: Jan. 1, 2019

(54) CONDITIONING SYSTEM OF THE FREE COOLING TYPE FOR ENVIRONMENTS, METHOD OF OPERATION OF A SAID CONDITIONING SYSTEM, AND APPARATUS FOR CARRYING OUT SUCH METHOD

(71) Applicant: EMERSON NETWORK POWER S.R.L., Piove di Sacco (IT)

(72) Inventor: Pierpaolo Barbato, Noventa Padovana (IT)

(73) Assignee: EMERSON NETWORK POWER S.R.L., Piove di Sacco (IT)

( * ) Notice: Subject to any disclaimer, the term of this patent is extended or adjusted under 35 U.S.C. 154(b) by 147 days.

(21) Appl. No.: 14/937,106

(22) Filed: Nov. 10, 2015

(65) Prior Publication Data

US 2016/0131375 A1 May 12, 2016

(30) Foreign Application Priority Data

Nov. 11, 2014 (IT) .............................. PD2014A0302

(51) Int. Cl.
*F25B 9/06* (2006.01)
*F24F 5/00* (2006.01)
(Continued)

(52) U.S. Cl.
CPC ............ *F24F 5/0035* (2013.01); *F24F 11/77* (2018.01); *F24F 12/006* (2013.01);
(Continued)

(58) Field of Classification Search
CPC ........ F24F 5/0035; F24F 11/17; F24F 12/006; F24F 11/47; F24F 2110/22; F24F 11/46;
(Continued)

(56) References Cited

U.S. PATENT DOCUMENTS 5,858,219 A * 1/1999 Kusmierz ............. C02F 1/4602
210/167.3
6,935,132 B1 8/2005 Urch
(Continued)

FOREIGN PATENT DOCUMENTS

| CN | 101813361 A | 8/2010 |
| DE | 102009048543 A1 | 4/2011 |
| EP | 2264372 A2 | 12/2010 |
| EP | 2436998 A2 | 4/2012 |

OTHER PUBLICATIONS

English Abstract of WO 2011/042126 A1, dated Apr. 14, 2011.
(Continued)

*Primary Examiner* — Melvin Jones
(74) *Attorney, Agent, or Firm* — Scully, Scott, Murphy & Presser, P.C.

(57) ABSTRACT

A conditioning system of the free cooling type for environments and particularly for computing centers, which comprises:
a conditioning unit of the free cooling type provided with an evaporative cooler using water,
first fans, for the exit to the outside environment of a stream of warm air in output from said conditioning unit,
second fans for emitting cool, conditioned air from said conditioning unit,
elements for accumulating reserve water which are interconnected to the conditioning unit,
a detector for detecting the presence of a flow of water in input to the accumulation elements, which are interconnected with an electronic unit for the control and management of the conditioning system.

12 Claims, 3 Drawing Sheets

(51) Int. Cl.
*F24F 12/00* (2006.01)
*H05K 7/20* (2006.01)
*F24F 11/77* (2018.01)
*F24F 1/00* (2011.01)
*F24F 110/22* (2018.01)
*F24F 11/46* (2018.01)
*F24F 11/47* (2018.01)

(52) U.S. Cl.
CPC .......... *H05K 7/20745* (2013.01); *F24F 11/46* (2018.01); *F24F 11/47* (2018.01); *F24F 2001/0088* (2013.01); *F24F 2001/0092* (2013.01); *F24F 2110/22* (2018.01); *Y02B 30/542* (2013.01); *Y02B 30/545* (2013.01); *Y02B 30/563* (2013.01); *Y02B 30/746* (2013.01)

(58) Field of Classification Search
CPC ......... F24F 2001/0092; H05K 7/20745; Y02B 30/542; Y02B 30/545; Y02B 30/563; Y02B 30/746
USPC ..................... 62/259.1, 259.2, 121
See application file for complete search history.

(56) References Cited

U.S. PATENT DOCUMENTS

| | | | |
|---|---|---|---|
| 6,973,801 B1 * | 12/2005 | Campbell | H01L 23/473 165/104.32 |
| 7,864,530 B1 * | 1/2011 | Hamburgen | H05K 7/20827 165/104.33 |
| 8,151,578 B1 | 4/2012 | Morales et al. | |
| 8,223,495 B1 | 7/2012 | Carlson et al. | |
| 8,635,881 B2 * | 1/2014 | Carlson | F24F 11/0001 62/168 |
| 2005/0056042 A1 | 3/2005 | Bourne et al. | |
| 2006/0191413 A1 | 8/2006 | Weidmann | |
| 2011/0256822 A1 | 10/2011 | Carlson | |

OTHER PUBLICATIONS

Italian Search Report and Written Opinion dated Jul. 23, 2015 issued in IT PD20140302.
Extended Partial European Search Report dated Jul. 14, 2016 received in European Patent Application No. 15 19 4029.3.

* cited by examiner

CONDITIONING SYSTEM OF THE FREE COOLING TYPE FOR ENVIRONMENTS, METHOD OF OPERATION OF A SAID CONDITIONING SYSTEM, AND APPARATUS FOR CARRYING OUT SUCH METHOD

The present invention relates to a conditioning system of the free cooling type for environments, and particularly for computing centers, as well as a method of operation of such a conditioning system.

The invention also relates to an apparatus for carrying out such method.

Nowadays conditioning systems of the direct or indirect free cooling type, for air-conditioning computing centers, are known and very widespread.

The term 'free cooling' means the distinctive function of a conditioning system of using external air if the conditions allow it.

Such systems use water evaporation machines as the principal system for cooling air, such air being drawn from outside, cooled and introduced directly into the computing center, a system known in the jargon as 'direct free cooling'; or evaporation machines that comprise an air/air exchanger which uses outside air to cool the warm air returning from the computing center, which is then re-introduced into the same computing center, a system known in the jargon as 'indirect free cooling'.

For such conditioning systems, the availability of water is essential in order to be able to ensure cooling.

For this reason the end user has one or more cisterns installed for accumulating reserve water in the event of interruption of the water service to which the system is connected.

Usually an indirect or direct evaporative unit is set to optimize the consumption of electricity and water based on the respective costs of electricity and water; such units are usually set in the factory so that evaporative cooling, i.e. using water to cool the air in input from outside, is used first, followed only subsequently by the actuation of the external fans at maximum speed in dry mode, i.e. with air cooled without using water, in order to supply the cooling power required.

So, for example, to provide air at 24° C. to a computing center, a conventional conditioning system can begin to work with water at a temperature comprised between 5° C. and 19° C., and on a summer's day such a system can be called on to function for twenty-four hours, using water for all that time.

When a computing center is designed to work with a direct or indirect evaporative system, one of the requirements is to identify the maximum consumption of water for a time period of twenty-four or thirty-six hours, selecting the worst day of the year in terms of maximum cooling requirements. This leads the user to provide a water reserve that is such as to ensure full cooling capacity even in the event of interruption of the water service.

Such reserve usually takes the form of one or more tanks, each one capable of containing many cubic meters of water.

Such tanks are usually positioned proximate to of the evaporative conditioning units.

Such tanks have to be kept at a temperature lower than 21° C. in order to prevent the proliferation of bacteria, or alternatively suitable disinfectants have to be added to the water in the tanks.

Each accumulation tank therefore has a not insignificant running/maintenance cost, which comprises costs of provision and installation of the tank proper, costs of disinfectants and chemical additives, costs of cleaning of the tank, and costs for cooling such tank.

The aim of the present invention is to provide a conditioning system of the indirect or direct free cooling type, as well as a method of operation of such a conditioning system, which are capable of overcoming the above mentioned limitations of conventional, similar conditioning systems.

Within this aim, an object of the invention is to provide an apparatus for carrying out such method.

Another object of the invention is to provide a system and a method for its operation thanks to which the costs of provision, running and maintenance of the water reserve are reduced.

Another object of the invention is to provide a system and a method for its operation which make it possible to optimize the consumption of such system.

This aim and these and other objects which will become better apparent hereinafter are achieved by a method of operation of a conditioning system, such conditioning system, of the free cooling type for environments and particularly for computing centers, comprising:

a conditioning unit of the free cooling type provided with evaporative cooling means using water, first fans for the exit to the outside environment of a stream of warm air, which is heated by the passage through said conditioning unit or in output from an environment to be air-conditioned, second fans for introducing cool, conditioned air that originates from said conditioning unit, means for accumulating reserve water which are interconnected to said conditioning unit, means for detecting the presence of a flow of water in input to the accumulation means, which are interconnected with an electronic unit for the control and management of the conditioning system, said method being characterized in that it comprises the following operations:

detecting the temperature at the point of delivery, to an environment to be air-conditioned, of said conditioning unit and comparing said detected temperature with a set setpoint temperature, based on the detected outside temperature, on the detected outside humidity, on the setpoint temperature for the air at the point of delivery into the environment to be air-conditioned, on the cost of electricity and on the cost of the water used by said conditioning unit, determining the optimum operating mode for said system from a plurality of operating modes, if the optimum operating mode of the conditioning system does not require the consumption of water, then the cooling power is regulated by adjusting the speed of said first fans, said conditioning unit operating without the addition of water, if the optimum mode requires the consumption of water, then detecting the presence of a flow of water in input to said accumulation means, if the presence of a flow of water in input to said accumulation means is detected, then the operating mode is optimized with respect to the cost of the water and the cost of the electricity, if the presence of a flow of water in input to said accumulation means is not detected, then check if the demand for cooling with respect to a set emergency setpoint temperature is met without water, if it is found that the demand for cooling with respect to a set emergency setpoint temperature is not met without water, then the cooling power is regulated by adjusting the speed of said first fans, with the aid of the evaporative cooling means of the conditioning unit, i.e., with the addition of water, if it is found that the demand for cooling with respect to a set emergency setpoint temperature is met without water, then the cooling power is regulated by adjusting the speed of said first fans with said conditioning unit operating without the addition of water.

Conveniently, the invention also relates to a conditioning system of the free cooling type for environments and particularly for computing centers, characterized in that it comprises:

a conditioning unit of the free cooling type provided with evaporative cooling means using water, first fans for the exit to the outside environment of a stream of warm air in output from said conditioning unit or in output from an environment to be air-conditioned, second fans for emitting cool, conditioned air from said conditioning unit, means for accumulating reserve water which are interconnected to said conditioning unit, means for detecting the presence of a flow of water in input to the accumulation means, which are interconnected with an electronic unit for the control and management of the conditioning system.

Further characteristics and advantages of the invention will become better apparent from the detailed description that follows of a preferred, but not exclusive, embodiment of the method and of the system according to the invention, which is illustrated for the purposes of non-limiting example in the accompanying drawings wherein.

Figure 1:
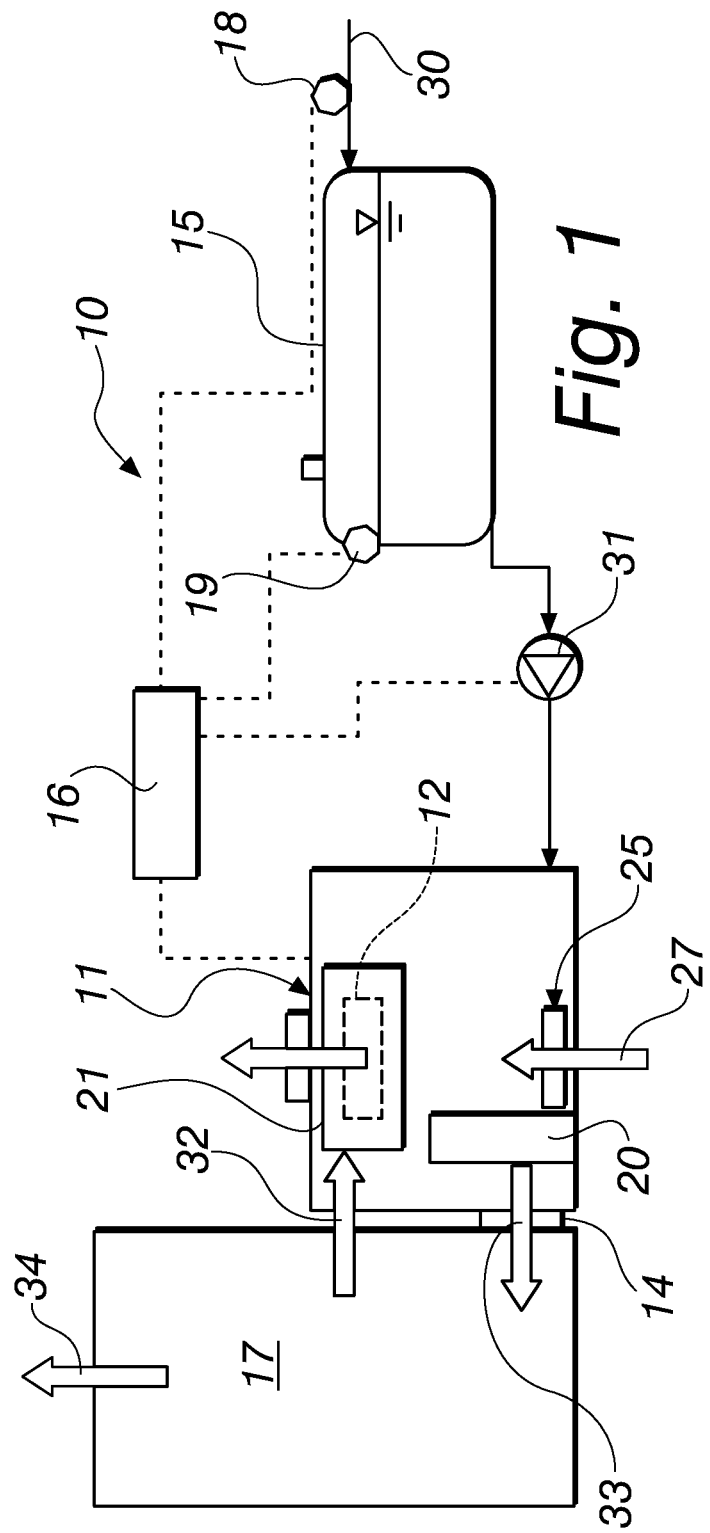
FIG. 1 is a schematic view of a system according to the invention.
Figure 2:
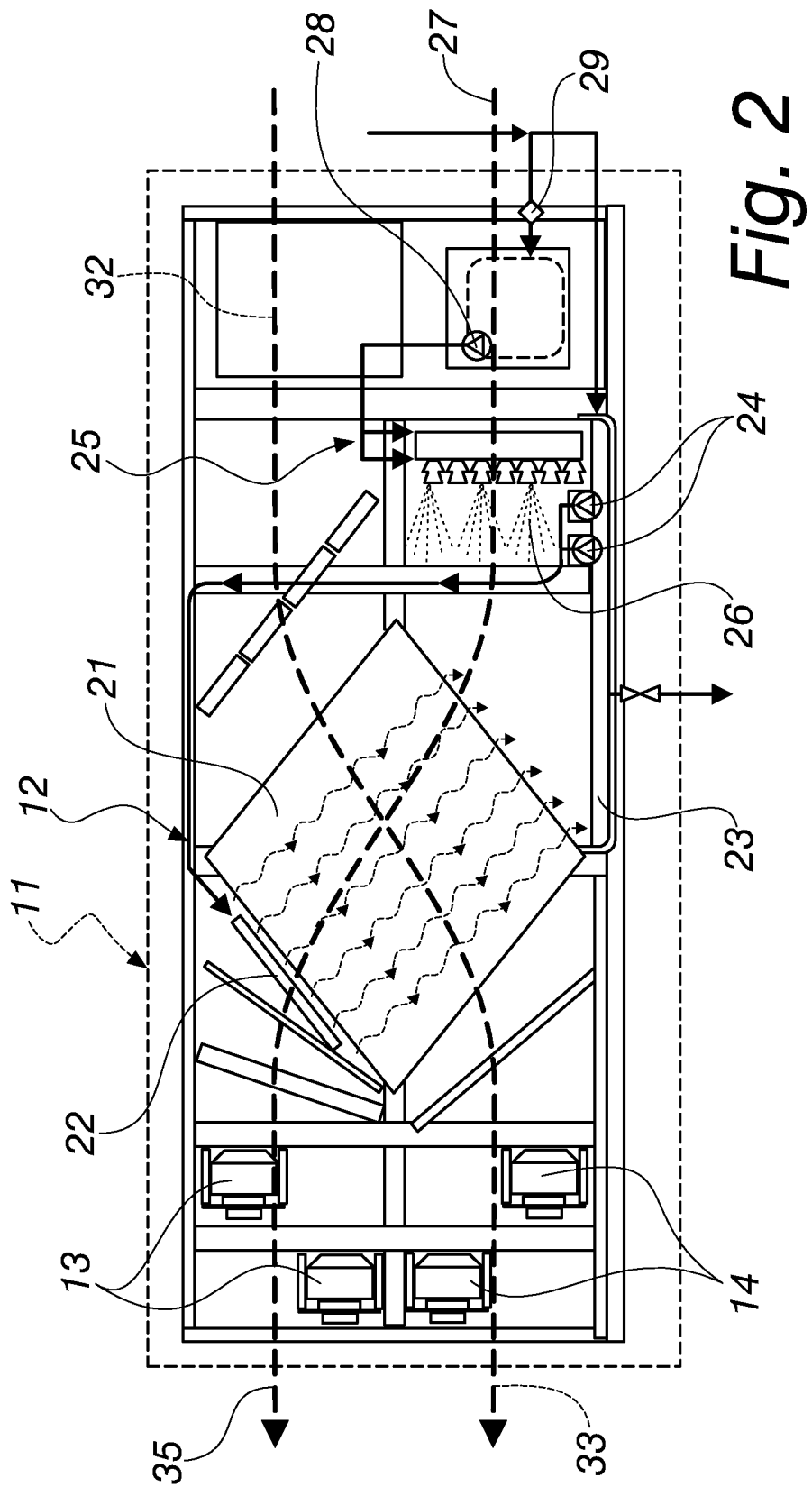
FIG. 2 is a schematic side view of a detail of the system according to the invention.

With reference to the figures, a conditioning system of the free cooling type for environments and particularly for computing centers, according to the invention, is generally designated with the reference numeral 10.

Such system 10 comprises:

a conditioning unit of the free cooling type 11 provided with evaporative cooling means using water 12, better described hereinafter, for cooling the air in the conditioning unit 11, first fans 13 for the exit to the outside environment of a stream of warm air, which is heated by the passage through the conditioning unit 11, second fans 14 for introducing cool, conditioned air that originates from the conditioning unit 11 into an environment 17 to be air-conditioned, for example a computing center, means 15 for accumulating reserve water which are interconnected to the conditioning unit 11, means for detecting the presence of a flow of water in input to the accumulation means 15, which are interconnected with an electronic unit 16 for the control and management of the conditioning system 10.

Such means for detecting the presence of a flow of water in input to the accumulation means 15 comprise a flow switch 18 which is arranged at the inlet of the accumulation means 15 and is adapted to detect the passage of water from a water mains 30 to which the accumulation means 15 are connected.

The accumulation means 15 can be constituted by one or more tanks for containing water.

The flow switch 18 directly detects whether the flow of water from the water mains 30 is regular or otherwise.

Alternatively, the means for detecting the presence of a flow of water in input to the accumulation means 15 can be constituted by a level switch 19 which is arranged inside the accumulation means 15 and is adapted to detect the level of the reserve water inside the accumulation means 15.

The level switch 19 indirectly detects the flow of water in input to the accumulation means 15, by detecting the lowering of the level of the water in the accumulation means 15; such lowering occurs when the accumulation means 15 do not receive water from the water mains 30.

In a variation of embodiment, the conditioning unit 11 also comprises an auxiliary cooling device 20, which is constituted for example by a direct-expansion cooling circuit or constituted by a cooled-water system; it is installed within the conditioning unit 11 in order to provide standby auxiliary cooling power or to supplement the cooling power supplied by the evaporative cooling means using water 12.

The conditioning unit 11 is, for example, the indirect free cooling type, with an air/air exchanger 21.

The evaporative cooling means 12 comprise:

nozzles 22 for distributing cooling water within the air/air exchanger 21, a tank 23 for collecting the water that has not evaporated, one or more recirculation pumps 24 for drawing water from the collection tank 23 to the nozzles 22.

In a different embodiment, not shown for the sake of simplicity, the air conditioning unit 11 is of the direct free cooling type; in such case the first fans are arranged in output from an environment to be air-conditioned, and the warm air exits to the outside directly from the environment to be air-conditioned.

The air conditioning unit 11 comprises water cooling means 25 for the air stream in input to the conditioning unit 11.

The water cooling means 25 take the form for example of a series of atomization nozzles 26 which are adapted to atomize water in the air stream 27 in input to the conditioning unit 11.

The atomization nozzles 26 are optionally served by a pressurization pump 28 which in turn is preceded by a water filter 29.

The atomization nozzles 26 can be substituted by an adiabatic mat, of conventional type, which performs the same function.

The flow of air in input 27 is adapted to be cooled by passing through the air/air exchanger 21 and with the intervention, if required, of the evaporative cooling means using water 12.

The electronic control unit 16 processes the signals originating from the detection means, i.e. from the flow switch 18 or from the level switch 19, and drives the devices that govern the operation of the conditioning unit 11, including a recycling pump 31 adapted to provide the addition of water with a minimum useful pressure to the evaporative cooling means using water 12, the accumulation means 15 being at a pressure proximate to atmospheric pressure and therefore substantially insufficient for the correct operation of the evaporative cooling means 12.

The reference numeral 32 designates the stream of warm air exiting from the air-conditioned environment 17 and directed to the conditioning unit 11 in order to be cooled by passing through the air/air exchanger 21, in the indirect free cooling case.

The reference numeral 33 designates the stream of cool air emitted by the conditioning unit 11 and introduced into the environment to be air-conditioned 17, in the indirect free cooling case.

The reference numeral 34 designates the stream of warm air exiting from the environment to be air-conditioned 17 to the outside environment, and replaced by the stream of cool air in input 33, in the direct free cooling case.

The reference numeral 35 designates the stream of warm air expelled by the conditioning unit 11, after having been used to cool the air of the environment to be air-conditioned 17; if the evaporative cooling means using water 12 entered operation then this stream of air will have a high degree of humidity.

The invention also relates to a method of operation of a conditioning system 10 as described above.

Figure 3:
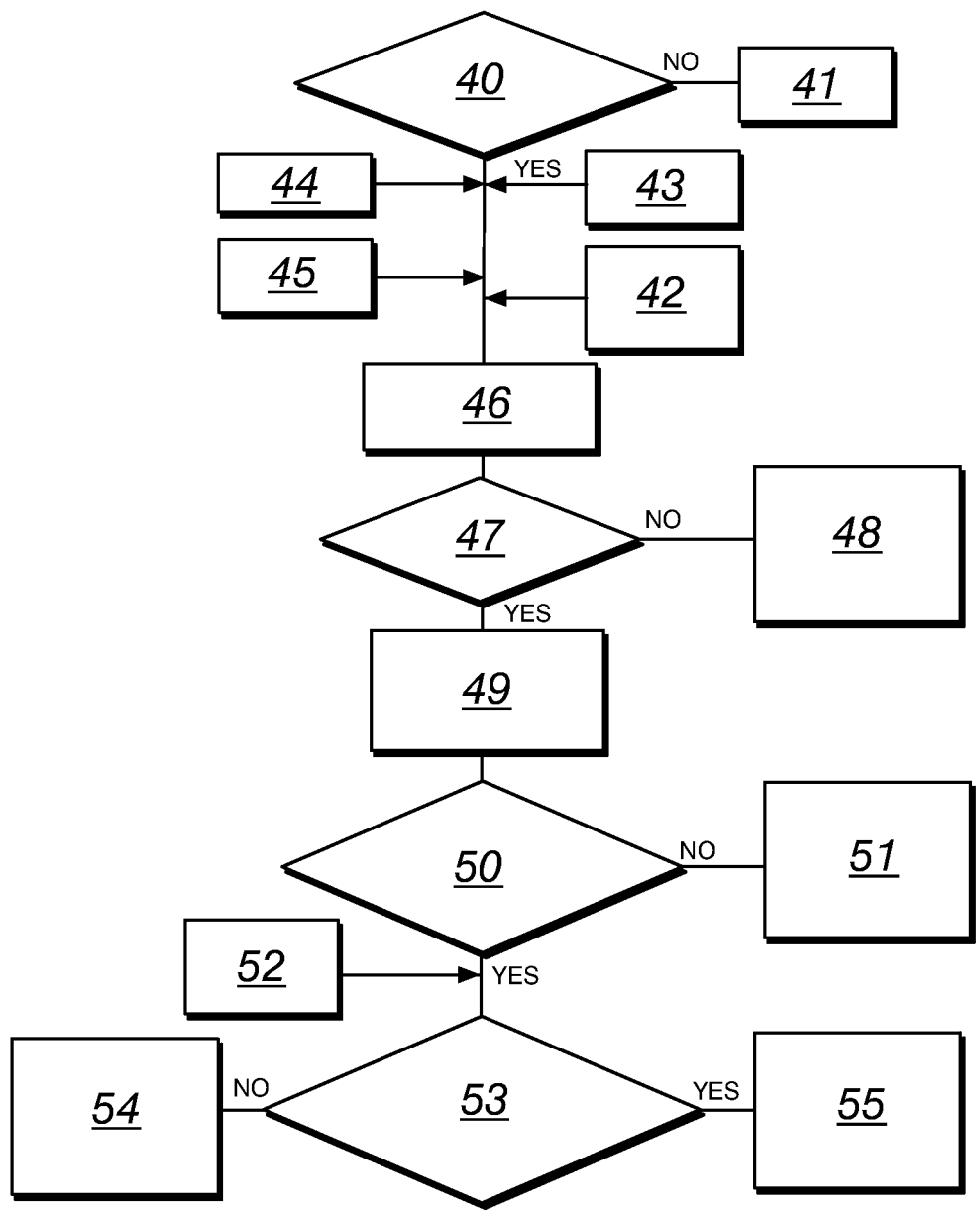
FIG. 3 is a block diagram of a method of operation of a system according to the invention.

Such method is shown schematically in FIG. 3.

Such method comprises the following operations:

detecting the temperature of the stream of cool air 33 at the point of delivery of the conditioning unit 11, to the environment to be air-conditioned 17, and comparing such detected temperature with a set setpoint temperature; such step is designated in FIG. 3 by block 40;

if the detection does not warrant a requirement to cool the environment 17, then the conditioning unit 11 remains in stand-by (block 41);

if the detection warrants a requirement to cool the environment 17, then, based on the detected outside temperature (block 42), on the detected outside humidity (block 42), on the setpoint temperature for the air at the point of delivery into the environment to be air-conditioned (block 43), on the cost of electricity (block 44) and on the cost of the water (block 45) used by the conditioning unit 11, determining, by way of the electronic unit 16, the optimum operating mode for the system 10 from a plurality of operating modes, an operation shown schematically by block 46.

The operating modes are, for example, with operation of the evaporative cooling means 12, or without operation of the evaporative cooling means 12, or with operation of the auxiliary cooling device 20, if present, in combination or otherwise with the evaporative cooling means 12.

Based on the optimal operating mode calculated, a check is made to see whether the use of water is required, and such check is shown schematically by block 47.

If the optimum operating mode of the conditioning system 10 does not require the consumption of water, then (block 48) the cooling power is regulated by adjusting the speed of the first fans 13, the conditioning unit 11 operating without the addition of water.

If the optimum mode (block 49) requires the consumption of water, then the presence of a flow of water in input to the accumulation means 15 is detected, by way of either the flow switch 18 or the level switch 19.

By way of the control unit 13, a check is made (block 50) to see if there is a flow of water from water mains 30 or if there is no flow of water from the water mains 30.

If the presence of a flow of water in input to the accumulation means 15 is detected, then the operating mode is optimized with respect to the cost of the water and the cost of the electricity (block 51).

If the presence of a flow of water in input to the accumulation means 15 is not detected, i.e. if the lack of supply of water from the water mains 30 to the accumulation means 15 is detected, then check (block 53) if the demand for cooling with respect to a set emergency setpoint temperature (block 52) is met without water.

If it is found that the demand for cooling with respect to a set emergency setpoint temperature is not met without water (block 54), then the cooling power is regulated by adjusting the speed of the first fans 13, with the aid of the evaporative cooling means 12 of the conditioning unit 11, i.e., with the addition of water.

If it is found that the demand for cooling with respect to a set emergency setpoint temperature is met without water (block 55), then the cooling power is regulated by adjusting the speed of the first fans 13 with the conditioning unit 11 operating without the addition of water.

The invention also relates to an apparatus for carrying out a method of operation of a conditioning system 10 as described above.

Such apparatus comprises means for detecting the presence of a flow of water in input to the accumulation means 15, as described above, which are interconnected with an electronic unit 16 for the control and management of the conditioning system 10.

Operation of the invention is the following.

When the method described above is used, by way of the electronic control unit 16, using the means for detecting the presence of a flow of water in input to the accumulation means 15, the control unit 16 is capable of detecting a condition of interruption of the water service from the mains 30; when this occurs, the method seeks to minimize the consumption of water, by giving priority to using the first fans 13 and then to integration with the auxiliary device 20, if present; the method resorts to using water from the accumulation means 15 only when the conditioning unit 11 is no longer capable of otherwise providing the capacity to cool to the desired delivery temperature.

With such method according to the invention, the user can select a setpoint temperature, for emergencies, for delivery of the stream of air 33 in input to the environment to be air-conditioned 17 which is higher than the usual and which is used in the event of an interruption of the water service, thus further reducing the need for water in order to produce the required cooling.

In practice it has been found that the invention fully achieves the intended aim and objects.

In fact with the invention a conditioning system and a method of operation thereof are provided which, thanks to the decrease of the use of water for the cooling, make it possible for the user to incur an initial cost for the provision of the accumulation means, i.e. of one or more tanks for accumulating reserve water, which is lower than similar conventional systems, in that thanks to such method accumulation means of from 30% to 80% smaller with respect to the known art are sufficient.

Therefore, thanks to the invention the running and maintenance costs of the accumulation means are considerably lower, being linked to the volume of the tanks which, since they are smaller in volume, bring the following advantages:

reduction of disinfectants and chemical additives, since less water is accumulated, faster cleaning of the tank, since the tanks are smaller, lower costs for cooling the tank (to contain the proliferation of bacteria), since the tanks are smaller and the quantity of water inside them is smaller than in similar conventional systems.

The invention, thus conceived, is susceptible of numerous modifications and variations, all of which are within the scope of the appended claims. Moreover, all the details may be substituted by other, technically equivalent elements.

In practice the components and the materials employed, provided they are compatible with the specific use, and the contingent dimensions and shapes, may be any according to requirements and to the state of the art.

The disclosures in Italian Patent Application No. PD2014A000302 (102014902308378) from which this application claims priority are incorporated herein by reference.

What is claimed is:

1. A method of operation of a conditioning system, such conditioning system, of a free cooling type for environments and particularly for computing centers, comprising:
   a conditioning unit of the free cooling type provided with evaporative cooling means using water,
   first fans for the exit to an outside environment of a stream of warm air, which is heated by the passage through said conditioning unit or in output from an environment to be air-conditioned,
   second fans for introducing cool, conditioned air that originates from said conditioning unit,
   one or more tanks that are interconnected to said conditioning unit,
   a switch configured to detect a presence of a flow of water in input to said one or more tanks, the switch selected from the group consisting of a level switch and a flow switch, which are interconnected with an electronic unit for the control and management of the conditioning system,
   wherein said method comprises the following steps:
      detecting a temperature at a point of delivery, to the environment to be air-conditioned, of said conditioning unit and comparing said detected temperature with a set setpoint temperature,
      based on the detected outside temperature, on a detected outside humidity, on the setpoint temperature for the air at the point of delivery into the environment to be air-conditioned, on the cost of electricity and on the cost of the water used by said conditioning unit, determining an optimum operating mode for said system from a plurality of operating modes,
      if the optimum operating mode of the conditioning system does not require the consumption of water, then a cooling power is regulated by adjusting a speed of said first fans, said conditioning unit operating without the addition of water,
      if the optimum mode requires the consumption of water, then detecting the presence of a flow of water in input to said one or more tanks,
      if the presence of a flow of water in input to said one or more tanks is detected, then the operating mode is optimized with respect to the cost of the water and the cost of the electricity,
      if the presence of a flow of water in input to said one or more tanks is not detected, then check if the demand for cooling with respect to a set emergency setpoint temperature is met without water,
      if it is found that a demand for cooling with respect to a set emergency setpoint temperature is not met without water, then the cooling power is regulated by adjusting the speed of said first fans, with the aid of the evaporative cooling means of the conditioning unit, i.e., with the addition of water,
      if it is found that the demand for cooling with respect to a set emergency setpoint temperature is met without water, then the cooling power is regulated by adjusting the speed of said first fans with said conditioning unit operating without the addition of water.

2. An apparatus for carrying out a method of operation of a conditioning system according to claim 1, comprising the switch in input to said one or more tanks, which are interconnected with an electronic unit for the control and management of the conditioning system.

3. A conditioning system of a free cooling type for environments and particularly for computing centers, comprising:
   a conditioning unit of the free cooling type provided with evaporative cooling means using water,
   first fans for the exit to an outside environment of a stream of warm air, which is heated by the passage through said conditioning unit or in output from an environment to be air-conditioned,
   second fans for introducing cool, conditioned air that originates from said conditioning unit,
   one or more tanks that are interconnected to said conditioning unit,
   a switch configured to detect a presence of a flow of water in input to said one or more tanks, which are interconnected with an electronic unit for the control and management of the conditioning system.

4. The system according to claim 3, wherein said switch comprises a flow switch which is arranged at the inlet of said one or more tanks and is adapted to detect the passage of water from a water mains to which said one or more tanks are connected.

5. The system according to claim 3, wherein said switch comprises a level switch which is arranged inside the one or more tanks and is adapted to detect the level of the reserve water inside said one or more tanks.

6. The system according to claim 3, wherein said conditioning unit comprises an auxiliary cooling device.

7. The system according to claim 3, wherein said conditioning unit is of an indirect free cooling type with an air/air exchanger.

8. The system according to claim 3, wherein said evaporative cooling means comprise:
   nozzles for distributing cooling water within said air/air exchanger,
   a tank for collecting the water that has not evaporated,
   one or more recirculation pumps for drawing water from said collection tank to said nozzles.

9. The system according to claim 3, wherein said conditioning unit is of a direct free cooling type.

10. The system according to claim 3, wherein said conditioning unit comprises water cooling means for the stream of air in input to the conditioning unit.

11. A conditioning system of a free cooling type for environments and particularly for computing centers, comprising:
    a conditioning unit of the free cooling type provided with evaporative cooling means using water,
    first fans for the exit to an outside environment of a stream of warm air, which is heated by the passage through said conditioning unit or in output from an environment to be air-conditioned,
    second fans for introducing cool, conditioned air that originates from said conditioning unit,
    one or more tanks that are interconnected to said conditioning unit,
    a switch configured to detect a presence of a flow of water in input to said one or more tanks, which are interconnected with an electronic unit for the control and management of the conditioning system, wherein said switch comprises a flow switch which is arranged at the inlet of said one or more tanks and is adapted to detect the passage of water from a water mains to which said one or more tanks are connected.

12. A conditioning system of a free cooling type for environments and particularly for computing centers, comprising:
- a conditioning unit of the free cooling type provided with evaporative cooling means using water,
- first fans for the exit to an outside environment of a stream of warm air, which is heated by the passage through said conditioning unit or in output from an environment to be air-conditioned,
- second fans for introducing cool, conditioned air that originates from said conditioning unit,
- one or more tanks that are interconnected to said conditioning unit,
- a switch configured to detect a presence of a flow of water in input to said one or more tanks, which are interconnected with an electronic unit for the control and management of the conditioning system, wherein said switch comprises a level switch which is arranged inside the one or more tanks and is adapted to detect the level of the reserve water inside said one or more tanks.

* * * * *